(12) United States Patent
Anc et al.

(10) Patent No.: US 7,173,260 B2
(45) Date of Patent: Feb. 6, 2007

(54) REMOVING BYPRODUCTS OF PHYSICAL AND CHEMICAL REACTIONS IN AN ION IMPLANTER

(75) Inventors: Maria J. Anc, Groveland, MA (US); Dale K. Stone, Lynnfield, MA (US); Christopher T. Reddy, Groveland, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 26 days.

(21) Appl. No.: 11/022,060

(22) Filed: Dec. 22, 2004

(65) Prior Publication Data
US 2006/0131514 A1    Jun. 22, 2006

(51) Int. Cl.
G21G 5/00 (2006.01)
H01L 21/76 (2006.01)

(52) U.S. Cl. .................. 250/492.1; 438/407; 438/423
(58) Field of Classification Search ........... 250/492.21, 250/492.2, 427, 492.3; 438/407, 423
See application file for complete search history.

(56) References Cited

U.S. PATENT DOCUMENTS

| | | | | |
|---|---|---|---|---|
| 4,842,676 A | * | 6/1989 | Jucha et al. | 438/711 |
| 5,248,636 A | * | 9/1993 | Davis et al. | 438/709 |
| 5,393,984 A | * | 2/1995 | Glavish | 250/396 ML |
| 5,483,077 A | * | 1/1996 | Glavish | 250/492.2 |
| 5,554,854 A | | 9/1996 | Blake | |
| 5,633,506 A | | 5/1997 | Blake | |
| 5,656,092 A | | 8/1997 | Blake et al. | |
| 5,998,798 A | | 12/1999 | Halling et al. | |
| 6,600,163 B2 | | 7/2003 | Halling | |
| 6,657,209 B2 | | 12/2003 | Halling | |
| 2003/0087504 A1 | * | 5/2003 | Erokhin et al. | 438/407 |
| 2006/0017010 A1 | * | 1/2006 | Vanderberg et al. | 250/492.1 |

OTHER PUBLICATIONS

Sinclair, Frank, Eacobacci Jr., Michael *Forces of Change Keep Reshaping Vacuum Systems in Ion Implant. Solid State Technology*, Vacuum Technology, 5 pages, Apr. 2004.

Horsky, Thomas N. *Photresist Outgassing in High Energy and High Current Ion Implantation.* 0-7803-4538-X/99/$10.00 © 1999 IEEE, 4 pages.

(Continued)

*Primary Examiner*—Nikita Wells
*Assistant Examiner*—Johnnie L Smith, II
(74) *Attorney, Agent, or Firm*—Tarolli, Sundheim, Covell & Tummino LLP

(57) ABSTRACT

An ion implanter having a source, a workpiece support and a transport system for delivering ions from the source to an ion implantation chamber that contains the workpiece support. The implanter includes one or more removable inserts mounted to an interior of either the transport system or the ion implantation chamber for collecting material entering either the transport system or the ion implantation chamber due to collisions between ions and the workpiece within the ion implantation chamber during ion processing of the workpiece. A temperature control coupled to the one or more removable inserts for maintaining the temperature of the insert at a controlled temperature to promote formation of a film on said insert during ion treatment due to collisions between ions and said workpiece.

24 Claims, 7 Drawing Sheets

OTHER PUBLICATIONS

Bulsara, Mayank, Standly, Bob, Celler, George, Myers, Dave, and Huff, Howard. *International Sematech Tackles Emerging Materials. Solid State Technology*, 4 pages, Jan. 2004.

Geppert, Linda. *The Amazing Vanishing Transistor Act. IEEE Spectrum*. 6 pages. Oct. 2002.

Markunas, Bob. *Mixing Signals with 3-D Integration. Semiconductor International*. 4 pages. Nov. 2002.

Hand, Aaron. *Value-Added Wafers Push Chips Ahead. Semiconductor International*. 4 pages. Nov. 2002.

Singer, Peter. *Strained Silicon Ready for Prime Time. Semiconductor International*. 1 page. Nov. 2002.

Singer, Peter. *Transisters with Fins Provide Double-Gate* Control. *Semi Conductor International*. 1 page. Nov. 2002.

* cited by examiner

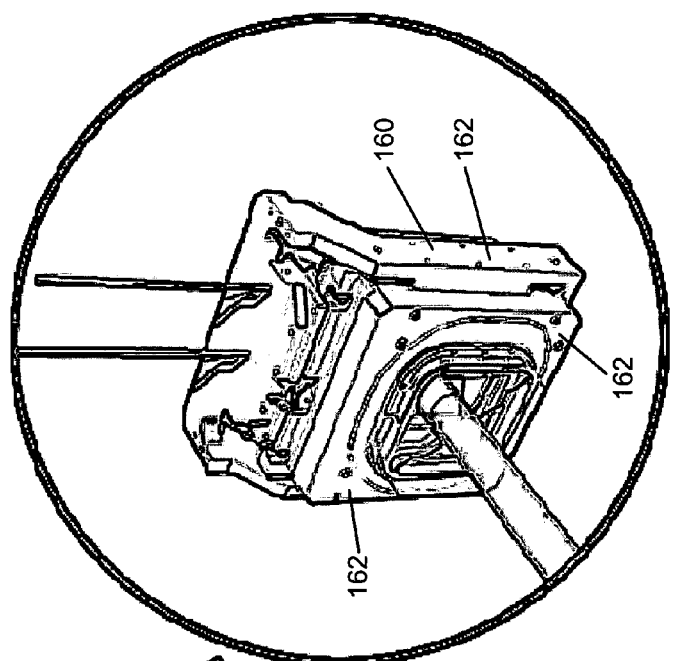
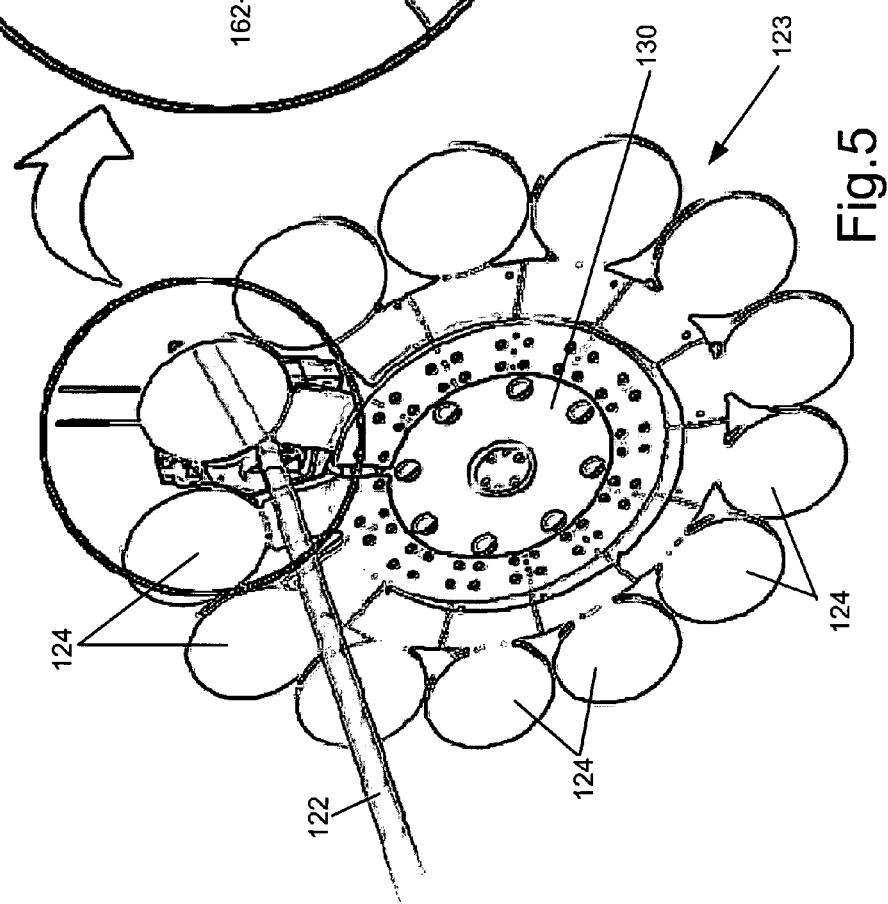
Fig. 5A
Fig. 5

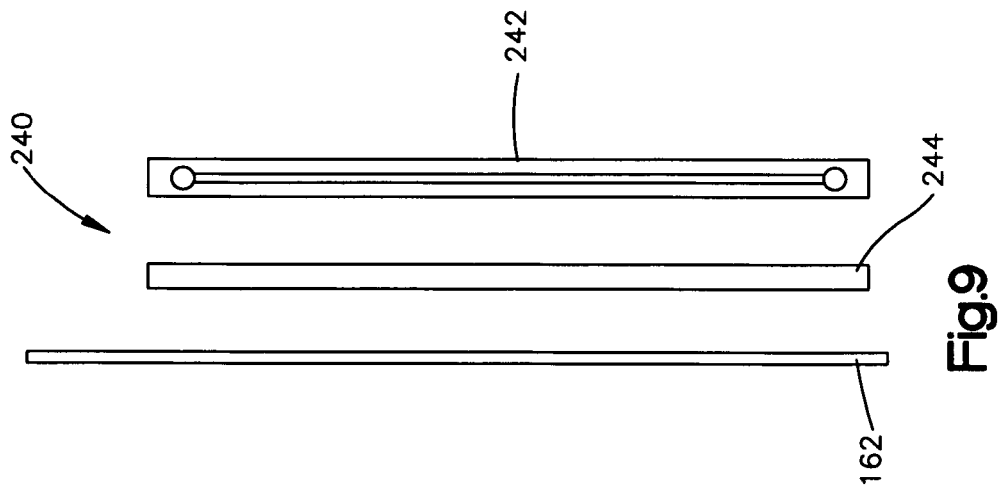
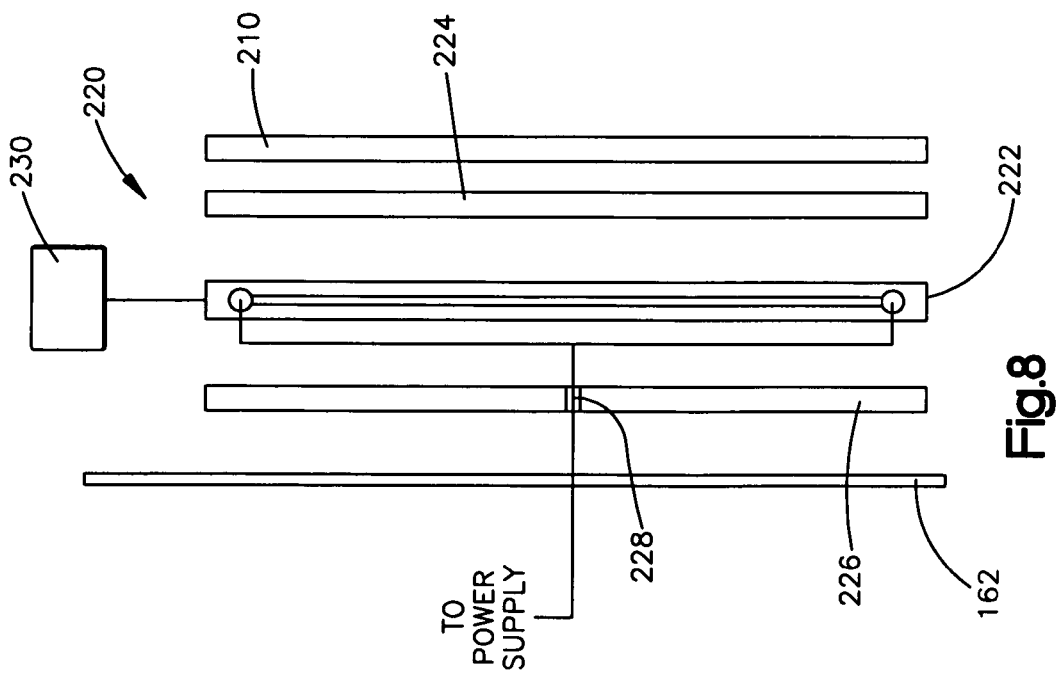

US 7,173,260 B2

REMOVING BYPRODUCTS OF PHYSICAL AND CHEMICAL REACTIONS IN AN ION IMPLANTER

FIELD OF THE INVENTION

The present invention concerns an ion implanter generally and more specifically relates to a system for gathering byproducts of physical and chemical reaction between ions of such an implanter and a treated region of a workpiece.

BACKGROUND ART

Ion implanters are known for use in treating workpieces such as silicon wafers. When such a wafer is bombarded with an ion beam, the silicon wafer is selectively doped with the ion impurity to create a semiconductor material from the original silicon material of the wafer. It is well known to create complex integrated circuits using such wafers. Circuit components on a small scale are created through use of masking techniques that selectively limit the exposure of the silicon to bombardment with the ions coming from an ion source.

Techniques for use with an ion implanter that use other than silicon substrates are becoming more common. Silicon-on-insulator technology involves use of an insulating base that supports a thin layer of silicon. Other processes use so called strained silicon. In this use, silicon is grown on top of a layer of silicon germanium so that the atoms in the silicon layer align with those in the slightly larger crystalline lattice of the SiGe. Other processes bond together wafers that are processed separately to produce a combined function circuit that operates as if it were processed on a single substrate.

Ion implanters generally fall into different categories that depend on their intended use. One class implanter has a support that supports multiple wafers which are moved through a suitably shaped ion beam. Other implanters treat or process one wafer at a time. In these so called serial implanters, the single wafer is mounted to a support that translates back and forth through a thin ribbon shaped beam coming from an ion source. Both type implanters include a source of ions which typically ionize a source material such as Boron in either a gaseous or solid state and selectively accelerate and filter the resultant ion species to form a ribbon beam having a controlled dose and energy.

In either type implanter, the beam is continuous and strikes all portions of the workpiece (typically a generally circular wafer) without regard to the structure of the workpiece. When used to create semiconductor devices on a silicon substrate, this means that the ion beam strikes or impinges on a photoresist layer that has been placed onto the wafer during previous processing at a different process station. The wafer (and selectively applied resist) is automatically moved into and out of an ion process chamber by use of one or more robots that automate the transfer into and out of the ion implanter.

Certain prior art patents owned by the assignee of the present invention have been concerned with contamination within an ion implantation chamber. These know patents include U.S. Pat. No. 5,656,092 to Blake et al, U.S. Pat. No. 5,633,506 to Blake, U.S. Pat. No. 5,554,854 to Blake, U.S. Pat. No. 5,998,798 to Halling et al, U.S. Pat. No. 6,600,163 to Halling, and U.S. Pat. No. 6,657,209 to Halling. The subject matter of these prior art patents are incorporated herein in their entirety.

In device and integrated circuits fabrication use of patterns on the wafer is necessary to achieve selective doping. It is not unusual that process steps such as ion implantation are performed into the wafers with patterned photoresist left on their surface. The photoresist needs to be thick enough to ensure that no significant fraction of the ions reach the wafer. An illustration of such a prior art implantation process is depicted in FIG. 7. In that figure a layer of resist R covers a substrate S in selected regions and exposes the substrate to ion implantation treatment in other regions.

During the implantation process the energetic ions impinging upon the photoresist layer break hydrocarbon bonds of the resist along their path till they come to rest. Damage of the photoresist by the incoming ions result in significant outgassing. RGA (residual gas analysis) has shown that a spectrum of the mass of the volatile components emitted from the resist covers the range between mass 2 ($H_2$) up to mass 28 (CO) or even 44 ($CO_2$). Numerous hydrocarbon molecules are evolving in the outgassing spectrum including $CH_2$, $CH_4$, $C_2H_2$. The partial pressure of these constituents is significant at early stage of implant process. See T. N. Horsky "Photoresist outgassing in high energy and high current ion implantation" Ion Implantation Technology Proceedings, ISBN 0-7803-4538-x, IEEE 1999, pp 654–657.

Observation of these species in the RGA spectrum was found to be non-specific to a particular formulae of the applied photoresist, thus it may be assumed to be applicable to a broad range of polymers used for patterning the workpieces.

In general, $H_2$ is assumed to be a major constituent of outgassing which is particularly true for implantation at high energy, and also at later stages of the implantation processes. At lower energy ranges of impinging ions and also for early stages of the implantation processes the $CO/N_2$ peak (mass 28) has been shown to be a dominant gas load followed by $H_2O$ and then $H_2$ (only 10% of the total gas load at this stage). This demonstrates that outgassing composition can change significantly over the wide energy range used in contemporary processes. See F. Sinclair, M. Eacobacci, Jr. "Forces of change keep reshaping vacuum setup in iom plant", Solid State Technology, April 2004, p.27, www-.solid-state.com.

Since process conditions of semiconductors extend over a broad range of energy, species and materials (new materials are being introduced) consideration needs to be given to these other chemicals released from the polymer, especially since they may dominate the composition of the gas at early stages of outgassing. In contemporary ion implanters cryogenic pumps are being used to ensure desired vacuum level in the process chamber. These pumps are particularly efficient in pumping hydrogen and dealing with gases such as Xenon (used in PEF for charge control purposes). However, increased $H_2$ pumping speed in improved design of the cryopumps does not solve the problem of other gases. At present there is no specific approach in the pumping scheme applied to evacuate hydrocarbons evolving from the damaged photoresist.

These volatile species reach the process chamber components and walls and form a coating which grows in thickness with time of processing photoresist-covered wafers in the implanter. Since such films are insulating, they may adversely affect functionality of components if they cover conductive surfaces. If the film grows in thickness beyond some critical level internal stress as well as incompatibility of thermal properties between the film and underlying materials may lead to cracking and delamination of the film and generate particle problems within the implantation chamber.

Another adverse effect of photoresist outgassing and poor vacuum control in the process chamber pertains to the interaction of the incident ions with the gases (released from the damaged photoresist) that may lead to the change of their charge state. This process can contribute to the errors in measurement of beam current and therefore to the dose errors (because the neutralized ions maintain their energy they are implanted if they reach the wafer). In addition it may also adversely affect dose uniformity. These interactions and the problems they create are addressed by the below described exemplary embodiments of the invention.

SUMMARY OF THE INVENTION

The present disclosure concerns an ion implanter having a source, a workpiece support and a transport system for delivering ions from the source to an ion implantation chamber that contains the workpiece support.

The implanter includes one or more removable inserts mounted to an interior of either the transport system or the ion implantation chamber for collecting material entering either the transport system or the ion implantation chamber due to collisions between ions and the workpiece within the ion implantation chamber during ion processing of the workpiece.

A temperature control coupled to the one or more removable inserts maintains the temperature of the insert at a controlled temperature to promote formation of a film on the insert during ion treatment due to collisions between ions and the workpiece.

These and other features of the invention will become better understood from the following detailed description of alternate embodiments which are described in conjunction with the drawings.

BRIEF DESCRIPTION OF THE DRAWINGS

FIGS. 5 and 5A are perspective views showing an end station for the alternate ion implanter shown in FIG. 4;

FIGS. 8 and 9 are illustrations showing attachment of gettering or collecting devices attached to an interior region of an ion treatment chamber.

EXEMPLARY EMBODIMENTS OF THE INVENTION

Advantages of use of the alternate exemplary embodiments were demonstrated by gathering data designed to imitate about a week of photoresist processing operation. In a fabrication plant, over 2000 implant processes may be performed in one implanter per month. The purpose of a majority of these processes is to selectively modify properties of the target substrate predominantly the photoresist patterned wafers that are being processed. After some period of time of such operation (2–3 months) substantial deposits of organic-matter-containing-films can be observed on surfaces of the process chamber, even surfaces shadowed from the sputtered materials. As these films grow thicker, such effects as internal stress, differences between thermal expansion coefficients of various surface materials and the film may easily overcome the film adhesion forces and result in film delamination, and undesired contamination/particle problems.

While during IC chip fabrication the processes can be designed to avoid extensive photoresist damage, to determine the usefulness of the exemplary embodiments, tests were conducted that fully carbonized the photoresist on the wafers to obtain as much of the volatile byproducts as possible with a minimum number of photoresist covered wafers (to reduce the cost and time of the testing). Silicon wafers covered with commercial photoresists were used in the testing. Acrylic based positive photoresist was chosen as was chemically amplified photoresist and PMMA resist known for high rate of outgassing. This reduced the cost of preparing the wafers and reduced the time for testing. Similar effects could be observed with any other photoresists known to those skilled in the art.

For cost and time effectiveness a full load of photoresist covered wafers was processed and process conditions were chosen to generate an abundance of outgassing products and fully utilize each load of PR wafers (complete destruction, carbonization of the PR, blistering and peeling off of the PR layer from the wafers). Photoresist on the wafers was bombarded with energetic ions of Phosphorous and $BF_2$ at energies high enough for an ion to travel through the thickness of the film or as deep as possible (in case of thick coatings) with the dose high enough to carbonize the PR completely.

The process conditions included implantation of Phos at 160 keV, $BF_2$ at 80 keV, Phos at 80 keV, $BF_2$ 30 keV at the doses on the order of 5E14 cm-2 to 5E15 cm-2. By choosing these implant conditions that were expected to effectively disintegrate the photoresist (depth of implant, critical dose) a noticeable amount of outgassing was produced and measurable coating films were obtained after processing of only 28 batches of a total of 375 PR wafers. It may be assumed that this use simulated the amount of outgassing equivalent to 1 week of operation of an ion implanter in production.

First ion implanter embodiment

Figure 1:
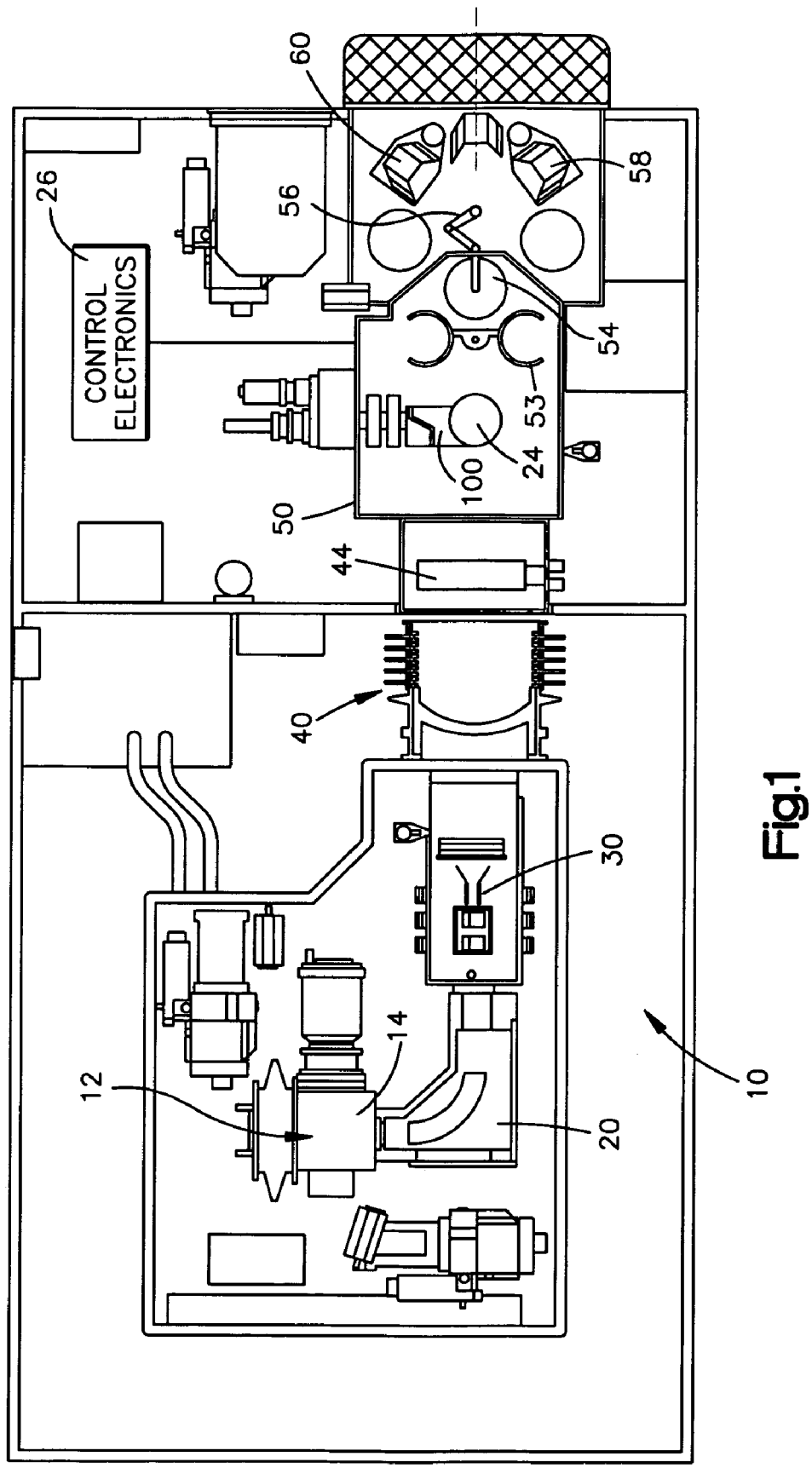
FIG. 1 is an overview schematic of an ion implanter constructed in accordance with the invention.

FIG. 1 is a schematic depiction of an ion implanter 10 such as Axcelis model MC-3 medium current ion implanter sold by the assignee of the present invention. Such an implanter is used for ion beam treatment of work-pieces such as silicon wafers for selective doping of those wafers. In such an implanter positive ions strike the work-piece after traversing a beam path from a source to an implanter station. Although the ion implanter 10 depicted in FIG. 1 is a medium current ion implanter other types of implanters including high energy implanters having a linac for accelerating ions are also within the scope of the invention.

The exemplary ion implanter 10 includes an ion source 12 for emitting ions generated from a source material. Typical source materials are either gases injected into a source housing 14 or solids that are vaporized to produce a plasma of ions within the source housing. As is well known in the prior art such a source 12 typically includes an extraction electrode for causing ions to exit the housing 14 along a beam path away from the source.

The implanter 10 depicted in FIG. 1 also includes a mass discriminating magnet 20 for bending ions away from an initial trajectory along a path of ion travel downstream from the ion source. Different species of the same ion are produced in the source 12 and the magnet discriminates between theses species. Ions of an undesirable mass are filtered by the magnet so that ions exiting the mass analyzing magnet 20 are of a single species of the ion used in beam treatment of a workpiece.

The ion implanter 10 also includes a beam scanning structure 30 which is positioned to intercept ions subsequent to the mass discriminating magnet 20 and scan ions from side to side in a controlled manner to form a ribbon like ion beam having a width. In one known design the scanning structure uses an electrostatic field that is created between two scan plates that are approximately 15 cm long and spaced apart by 5 cm. The electrode separation expands outwardly to a separation of about 7.5 cm at an exit end of the two scanning electrodes. Time varying voltages of up to +/−5 kilovolts of a controlled magnitude are applied to suitable amplifiers coupled to each plate by control electronics 26 to achieve a total plate voltage separation of 10 kv. Suitable sawtooth waveforms are applied by the control electronics to sweep the ions from side to side at a controlled frequency. Alternate means of creating a ribbon beam are use of time varying magnetic fields and use of structure that defines the beam exiting the source prior to species discrimination.

Returning to the exemplary structure shown in FIG. 1, the system includes lens structures 40 that accept ions moving along diverging paths from the scanning structure 30 and bends them as they are accelerated across a gap between curved electrodes to create substantially parallel ion trajectories for ions leaving the lens structures 40. Subsequent to leaving the lens structures 40, the ions that make up the beam are moving in generally parallel directions and form a thin ribbon or ribbon-like beam 42. (See FIG. 2) The beam 42 passes through an energy filter 44 which deflects ions downward due to their charge. This downward deflection removes neutral particles that have entered the beam during the upstream beam shaping before entering the filter 44.

A wafer workpiece 24 is moveably supported within an ion implantation chamber 50 by a workpiece support structure 100. Workpieces 24 (typically wafers) are inserted into the chamber 50 by means of a load lock 54 and moved to a wafer clamp by an in vacuum robot 53. Outside the chamber 50 the wafers are manipulated by a robot 56 which removes untreated wafers from a storage cassette 58 and returns treated wafers to a second cassette 60 or alternatively can return the treated wafers from the same cassette from which they were withdrawn.

Generally, the extent of the ribbon ion beam 42 is sufficient to implant an entire implantation surface of the workpiece 24. That is, if the workpiece 24 has a diameter of 300 mm, control electronics 26 will appropriately energize the scanning electrodes 30 such that a horizontal extent or width, W (FIG. 2) of the ribbon ion beam 42 entering the implantation chamber will be at least 300 mm.

The workpiece support assembly 100 both supports and moves the workpiece 24 with respect to the ribbon ion beam 42 during implantation such that a desired implantation surface of the workpiece 24 is controllably implanted with ions. As mentioned previously, in addition to the scanning technique described above, those of skill in the art will recognize that the ribbon shape of the ribbon ion beam 42 within the implantation chamber 22 can be created in a number of alternate ways.

Prior to implantation, the workpiece support assembly 100 rotates the workpiece 24 from the horizontal orientation it assumes after transfer from the robot 53, to a vertical or near vertical position for implantation. If the workpiece 24 is vertical, that is, normal with respect to the ion beam 42, the implantation angle or angle of incidence is 0 degrees. It has been found that to minimize undesirable channeling effects, typically, a small but nonzero implantation angle is selected.

A single wafer is placed into the load lock 54 and the implantation chamber is pumped down to a desired vacuum. Within the implantation chamber the robot 53 grasps the workpiece 24, brings it within the implantation chamber 50 and places it on an electrostatic clamp or chuck of the workpiece support structure 100. The electrostatic clamp is energized to hold the workpiece 24 in place as it is re-oriented inside the chamber 50. Suitable electrostatic clamps are disclosed in U.S. Pat. No. 5,436,790, issued to Blake et al. on Jul. 25, 1995 and U.S. Pat. No. 5,444,597, issued to Blake et al. on Aug. 22, 1995, both of which are assigned to the assignee of the present invention. Both the '790 and '597 patents are incorporated herein in their respective entireties by reference. After ion implantation of the workpiece 24, the workpiece support structure 100 returns the workpiece 24 to a horizontal position and the electrostatic clamp is de-energized to release the workpiece for removal by the in vacuum robot 53 back through the load lock 54.

The workpiece support structure 100 is operated by the control electronics 26. (FIG. 5) The workpiece support structure 100 supports the workpiece 24 during implantation while providing both rotational (tilt and twist) and translational movement of the workpiece 24 with respect to the ribbon ion beam within the implantation chamber 22. By virtue of its rotational capability, the workpiece support structure 100 advantageously permits selection of a desired implantation angle or angle of incidence between the ion beam and the implantation surface of the workpiece.

By virtue of its translational or linear movement capability, the workpiece support structure 100 permits the implantation surface of the workpiece 24 to be moved within a plane fixed with respect to the desired implantation angle during implantation thereby both maintaining the desired implantation angle and additionally maintaining a distance that the ribbon ion beam travels from its entry into the interior of the implantation chamber 50 to the region where it impacts the implantation surface of the workpiece. Additional details concerning the wafer support structure are contained in issued U.S. Pat. No. 6,740,894 which is assigned to Axcelis Technologies and is incorporated in its entirety herein by reference.

Second Ion implanter embodiment

Figure 4:
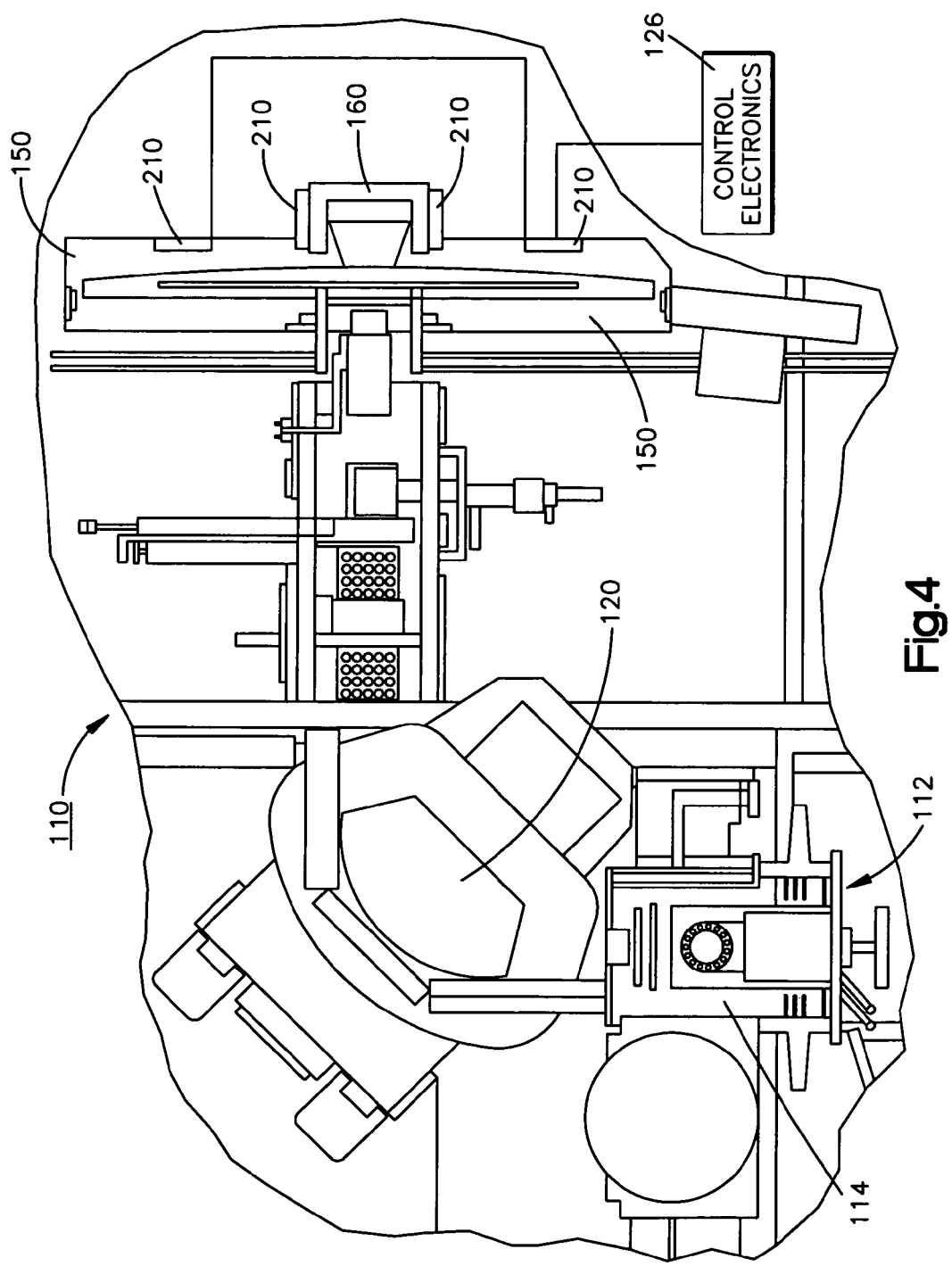
FIG. 4 is an overview of an alternate ion implanter architecture to the one depicted in FIG. 1.

FIG. 4 is a schematic depiction of an alternate ion implanter 110 such as Axcelis model HC3 ULTRA, GSD ULTRA or GSD/200E$^2$ high current ion implanter sold by the assignee of the present invention. Such an implanter is also used for ion beam treatment of work-pieces such as silicon wafers for selective doping of those wafers. Positive ions emitted from a source 112 move along an evacuated beam path to strike a number of moving work-pieces 124 in an array 123 of such workpieces.

The exemplary ion implanter 110 includes an ion source 112 for emitting ions generated from a source material. Typical source materials are either gases injected into a source housing 114 or solids that are vaporized to produce a plasma of ions within the source housing. As is well known in the prior art such a source 112 typically includes an extraction electrode for causing ions to exit the housing 114 along a beam path away from the source.

The implanter 110 depicted in FIG. 4 also includes a mass discriminating magnet 120 for bending ions away from an initial trajectory along a path of ion travel downstream from the ion source. Different species of the same ion are produced in the source 112 and the magnet discriminates between theses species. Ions of an undesirable mass are filtered by the magnet so that ions exiting the mass analyzing magnet 120 are of a single species of the ion used in beam treatment of a workpiece. After traversing the magnet 120 ions that make up a beam 122 of such ions are accelerated and strike wafers 124 (See FIG. 5) that are mounted to a wafer support 130 located within an ion implantation chamber 150.

FIGS. 5 and 5A depict an implanter end station within the implantation chamber 150 illustrate the positioning of a disk faraday 160 for measuring beam current. The disk faraday has surfaces 162 facing the beam that are in close proximity to the generally circular path followed by the workpiece wafers 124 that make up the array of such wafers.

The illustrated wafer support causes the wafers to move through the ion beam 122 and in addition is made to move up and down to assure that the entire surface of the wafer is treated. When the wafers move in this manner they scan past an oval shaped portion of the chamber since in addition to the circular path of rotation, a linear up and down scan stretches the otherwise circular movement path to an oval shape.

The two illustrated exemplary embodiments address a problem of excessive organic based film deposits on structure within the ion implantation chambers 50, 150. These deposits originate from the gas reactions and condensation of volatile radicals generated in the ion implantation chambers 50, 150 due to the interaction of the ion beam with surfaces in the chamber including photoresist film on the wafers 24, 124.

Figure 2:
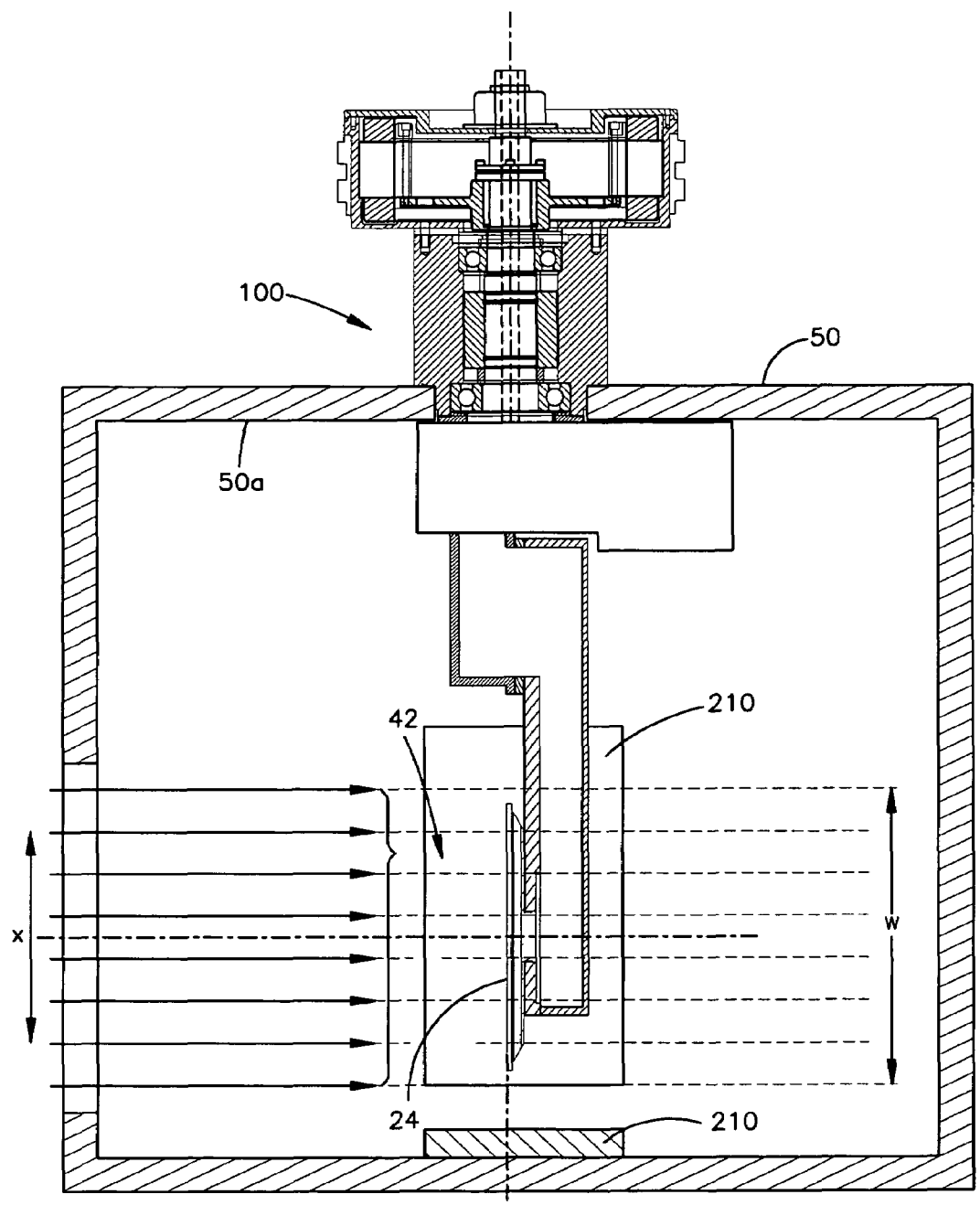
FIGS. 2 and 3 are side and front elevation views of an implantation chamber illustrating positioning of a workpiece support within the implantation chamber.
Figure 3:
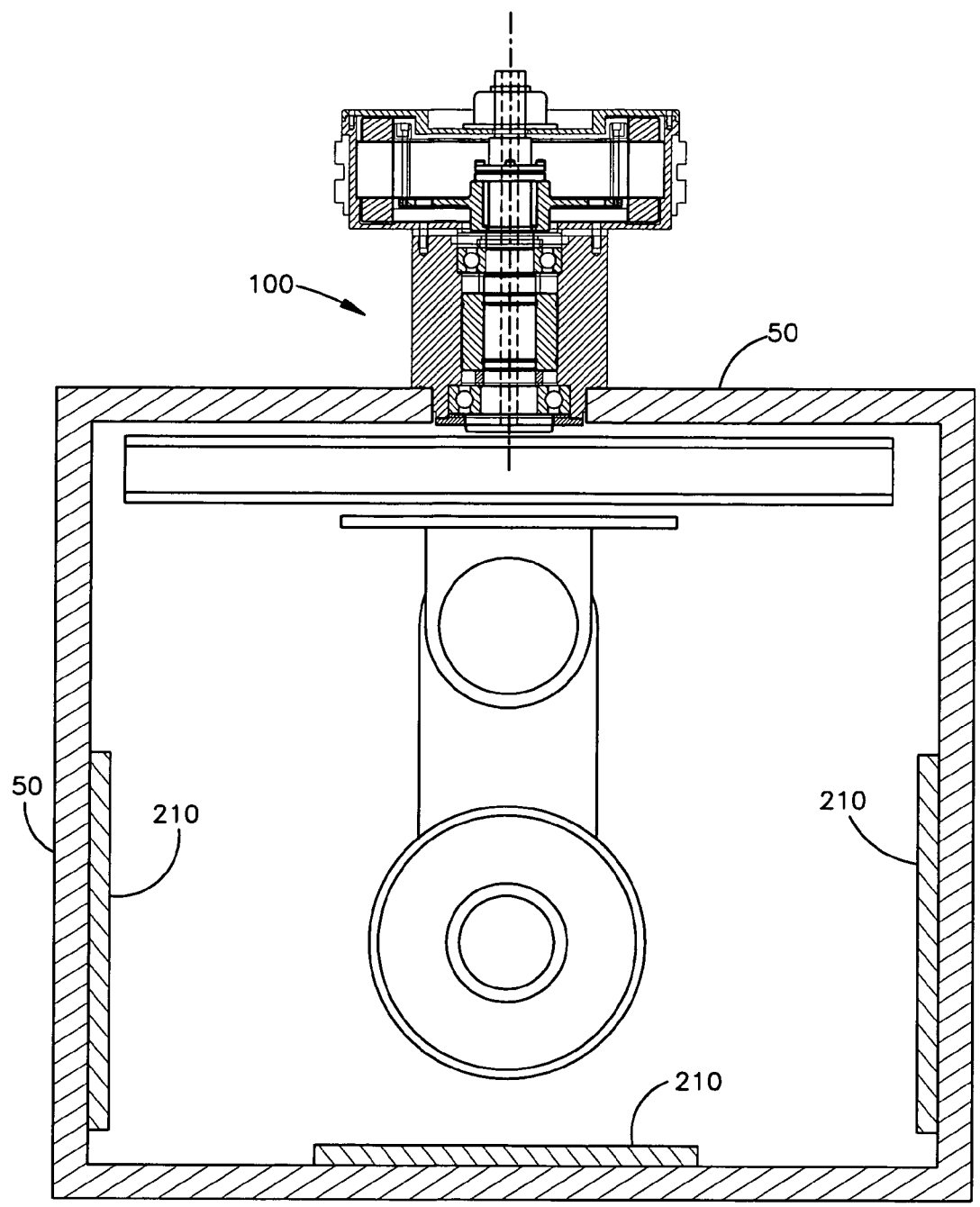

As seen in FIGS. 2–4, the alternate exemplary embodiments include a number of devices 210 at locations in the ion implantation chambers 50, 150. These devices 210 are constructed of aluminum and include roughened surfaces that face the chamber interior to maximize the build up of deposits on the outer exposed surfaces within the ion implantation chambers 50, 150. In the FIG. 4 embodiment, the disk faraday 160 defines surfaces 162 in close proximity to the path followed by the rotating wafer workpieces mounted to the support 130. Similarly, the up and down movment of the single wafer (FIGS. 2,3) is bounded by the devices 210 on the walls of the chamber 50.

Testing was conducted in a multi-wafer implanter process chamber similar to the chamber shown in FIG. 4. Prior to the experiment with the photoresist wafers measurement of the temperature in several locations in the process chamber during a high dose implantation process (Phosphorus 80 keV (beam energy), 20 mA (beam current), 1E16/cm2 (dose)) were performed and all surfaces were found to be less than 32 degrees Celsius.

Collecting Device Construction

During ion implantation, the work pieces 24, 124 and adjacent disk parts are typically cooled by a cooling system so that a temperature of process chamber walls and other assemblies in the process chamber are in equilibrium, typically lower than 30 C. In implanters without active cooling, the temperature of the implanted work piece may rise. In circuits fabricated without active cooling, such temperature rise may lead to inferior process results in terms of enhanced diffusion and excessive depth of junctions among others, and is not desired.

The exemplary method and apparatus used in collecting volatile carbon-containing molecules originating from outgassing of the photoresist bombarded by energetic ion beam is based on preferential condensation of volatile radicals, nucleation and film growth on heated surface(s) located in the process chamber away from a region of direct beam strike. Adding thermal energy to the collecting surface enables chemical reactions of the arriving species at these surfaces and promotes formation of the organic-based film. As volatile species arrive to the surface the process continues and the film grows in thickness. Such a collecting device can be viewed as acting as a "pump for hydrocarbons" that operates on a principle of chemical vapor deposition in the ion implanter process chamber. Formation of the film on the collecting surface leads to the depletion of the concentration of the source gases taking part in the reaction (including carbon containing species) near this surface and thus provides a thermodynamic driving force for the flow of these species to these surfaces.

The temperature of the collecting surfaces is preferably higher than the temperature of the surrounding parts of the process chambers 50, 150 and sufficiently high for an instantaneous reaction rate at the surface to make formation of the film being mass transport dependent and not surface reaction rate limited. The collecting surface would have to be at temperature higher than 50 C. and lower than 600 C., preferably in the range of 100–300 C. Preferably, the temperature of each such device should be controlled independently of the temperature of other collecting devices of the process chamber.

The collecting surface itself may be made of variety of the materials such as metals, alloys including carbon containing alloys, ceramics and polymers providing they are able to sustain the temperature range of interest in vacuum. The surface finish of these surfaces is achieved by typical machining, polishing, etching or combination of such techniques known to those skilled in the art. Materials and surface finish should be selected with consideration for their emissivity and resultant impact of radiative power on the work pieces. Preferably the surface finish and temperature of these devices in the process chamber would be optimized for film adhesion and formation of stable organic compounds to extend the service life of the device.

If the surface roughness and/or topography increase, the surface area for the film growth is increased while simultaneously reducing a thickness of the possible film growth under consistent process conditions. This may allow a longer period of operation of one device by virtue of the fact that a longer time will be needed to reach a critical thickness of the film. Once this critical thickness is achieved, internal stress and forces generated by thermal dissimilarity between the film and the substrate may generate cracks in the film and delamination. Smooth surfaces should also be effective as a substrate for growth of the organic-based film, however, a time of service may be different between a rough and a smooth surface.

FIG. 8 Multi-layer Device

A first design option shown in FIG. 8 includes an assembly 220 of a heater 222 and gettering surface/collector 210 attached physically one to the other. The susceptor or collector is made of a heat conducting material such as metal such as aluminum, an alloy, a non-outgassing and heat resistant polymer, or ceramic is attached to the surface of the heater 222 in good thermal contact with this heater. Thermal contact between the heater and susceptor may be provided by a layer of high thermal conductivity polymer 224 such as RTV deposited between them.

Heaters elements embedded in ceramic that is compatible with the vacuum environment of the implanter i.e. non-outgasssing (such as Kapton) are used. Heating of electrical conductors embedded in the heater substrate raises the temperature of the collector 210. This assembly 220 is attached to the process chamber walls, Faraday, disk or other parts of the process chamber and is thermally and electrically isolated from the supporting surfaces.

A thermal isolation material 226 is placed between the heater 222 and the underlying surface 162 and selectively releases the heater/collector from the surface 162 by breaking the attachment by force. This allows the assembly to be removed from the ion chamber and the film that collects with time to be cleaned from the surface of the collector. Another removal option is to break the layer 224 to remove only the susceptor 210 without the heater. Isolating material such as low thermal conductivity ceramic may be used, it may be sprayed or attached as a sheet of material. The heater 222 may conform to the shape of the process chamber wall 162 or part on which it is placed (dished out chamber), recesses, cavities etc. Alternately, a space or gap between the device 210 and the underlying substrate or surface 162 may provide thermal isolation in the vacuum environment of the chamber. The device may be mounted on studs that are non conductive in which case the collector 210 is removed by removing a mechanical fastener. Electrical connectors between a power supply and the conductors embedded in the heater 222 are compatible with a vacuum environment. In one embodiment, an electrical feedthrough 228 couples the heater 222 to a power supply outside of the process chamber. The power supply is most preferably part of the control electronics 26, 126. A battery 230 inside the chamber may alternately be used to power the heater 222 (or heaters) providing the battery is compatible with vacuum and does not interfere with the ion beam. An electrical protection circuit may be used to prevent uncontrolled drift or runaway of the heater. A temperature set-point controlled by adjusting power ON and OFF set points may be manually adjusted or software controlled from the control electronics 26, 126. These set points are monitoring by means of a thermistor also embedded in the heater 222. When a sensed temperature falls below the On set point the conductor in the heater is energized and when the temperature reaches the Off set point the conductor is deenergized. This will cause the temperature to gradually drop until the On set point is again reached.

FIG. 9 One-piece Device.

Another design option depicted in FIG. 9 an assembly 240 uses an exposed surface of a fused ceramic heater 242 bonded to a surface 162 by a releasable bonding material 244. The heater 242 acts as a susceptor or collector for the organic film or deposit another material directly on its surface without use of intermediate heat conducting media. The collecting device (both options of FIGS. 8 and 9) may be disposable or refurbishable if a suitable reclaim method is used. In the exemplary embodiments of FIGS. 8 and 9, the releasable bonding material is most preferably a ceramic or vacuum compatible epoxy.

Non-permanent attachment of the susceptor to the heater would favor removal of the susceptor/collector (only) at the end of the service period and replacing it with a clean part. The susceptor could be disposed or cleaned and placed again on the surface of the heater for another term of service. In case of permanent attachment of the susceptor to the heater or use of the fused heater the entire assembly is removed for cleaning or for disposal.

EXAMPLE

Multiple devices design comprised set of heated Aluminum plates whose surfaces were thermally isolated from one another, and located in close proximity to each other. Different temperature settings of individual plates were chosen to eliminate the possibility of a systematic pattern of interaction. One other Al plate was attached to the process chamber wall in close proximity of heated devices and thus was at the process chamber ambient temperature (<30 C) during the testing.

The devices were located above the opening of the disk Faraday, shown in the FIG. 5A i.e. near the location of beam interaction with the Photoresist wafers but away of the beam trajectory and away of the cone angle of back sputtering from the wafers and adjacent disk features. In such arrangement only gaseous species could reach the collector surfaces. Part of each collecting plate (regardless of its temperature) was masked (kapton tape was used in this case).

Figure 6:
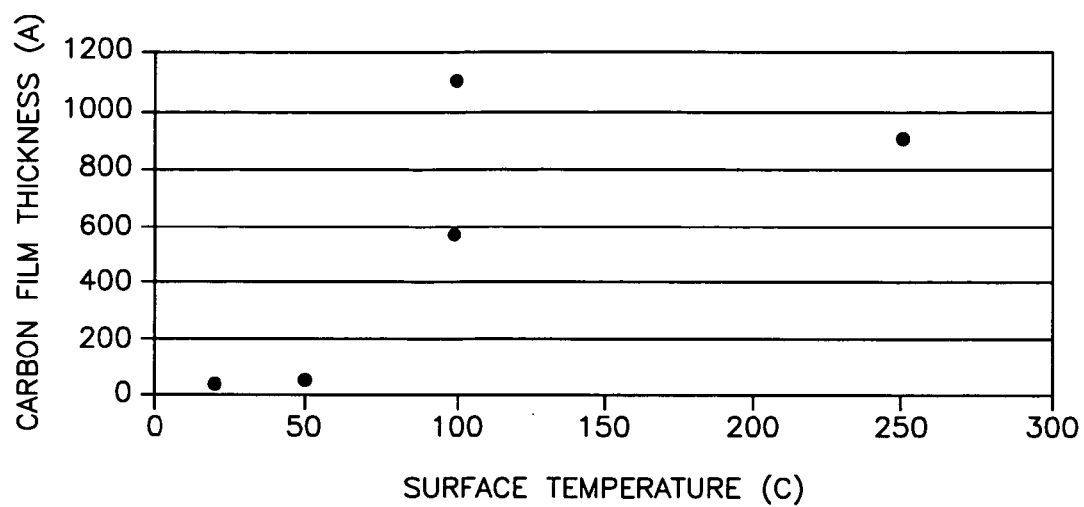
FIG. 6 is a graph of results obtained through use of the invention.
Figure 7:
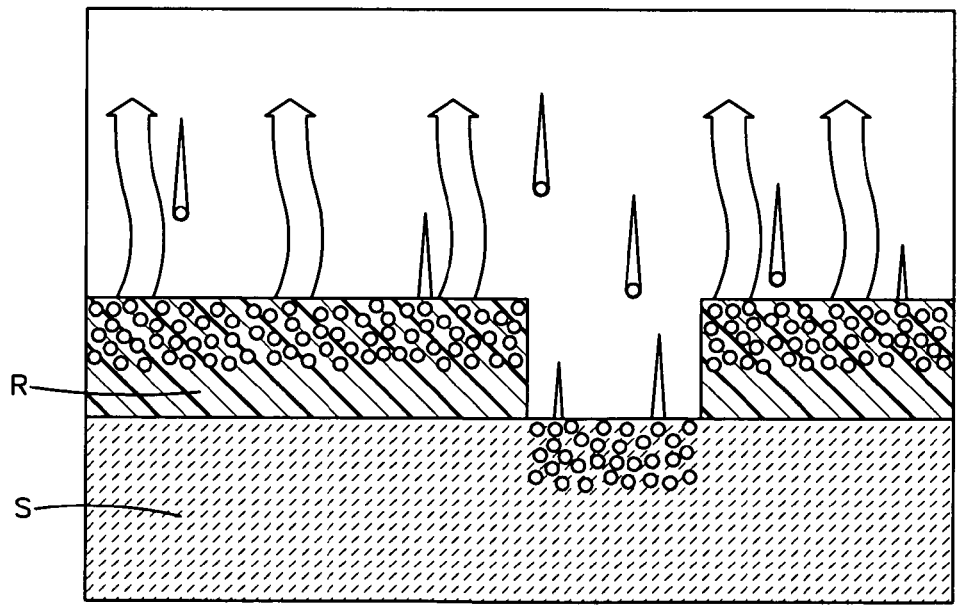
FIG. 7 is a schematic depiction showing photoresist damage with outgassing during ion implantation.

The analysis of the deposits was done using Auger Electron Spectroscopy along with profiling (milling on the deposited film and acquiring the spectrum). Concentration profiles of signature species were then plotted against depth. Measurable concentration of carbon was indicative of the organic coating. Measurable levels of Al and Mg indicated the Al alloy of the substrate. The results of this measurement with respect to the temperature of the gathering devices is shown in FIG. 6 as well as Table 1.

Since the gettering effect was observed after a relatively small fraction of typical production load was processed in the implanter it is expected that the proposed method is capable to reduce process induced contamination of the process chamber in production operation.

Table 1 below indicates temperature of the devices 210 in degress Celsius and the thickness in angstroms of carbon build up of the deposits on the devices 210.

TABLE 1

|  | Temp [C.] | | | | |
| --- | --- | --- | --- | --- | --- |
|  | 20 | 250 | 100 | 50 | 100 |
| Carbon film thickness | 42 | 900 | 550 | 48 | 1100 |

Temperature sequence in table 1 corresponds to the physical arrangement of the heaters in the experiment (looking from the ion source site toward the end station). All heated surfaces were aluminum 6061 pattern of temperature set-points and physical closure of the heated surfaces provide evidence of primary dependence of the thickness of the carbon film grown on theses surfaces on the temperature (compiled in FIG. 6).

A location of the devices may affect the thickness of the deposits if placed within the angular cone of back sputtered matter from various surfaces in the process chamber. In such case sputtered materials will be incorporated into the film.

The present invention has been described with a degree of particularity. It is the intent, however, that the invention include all modifications and alterations from the disclosed design falling within the spirit or scope of the appended claims.

The invention clamied is:

1. An ion implanter having a source, a workpiece support and a transport system for delivering ions in an ion beam from the source to an ion implantation chamber that contains the workpiece support, said ion implanter comprising:
   one or more inserts mounted to an interior wall of either the transport system or the ion implantation chamber out of the ion beam for collecting material entering either the transport system or the ion implantation chamber due to collisions between ions and structure within the ion implantation chamber during ion processing of a workpiece, and
   a temperature control coupled to the one or more inserts for maintaining the temperature of the one or more inserts at a controlled temperature to promote formation of a film on said insert during ion treatment of said workpiece.

2. The ion implanter of claim 1 additionally comprising a movable support that supports one or more wafer workpieces including a photoresist and wherein the inserts are positioned on walls of said implantation chamber in close proximity to a path of travel of movement of said one or more wafer workpieces within the chamber.

3. The ion implanter of claim 2 wherein the movable workpiece support comprises a rotating support for a plurality of wafer workpieces and wherein the inserts are positioned along an arc that corresponds to a path followed by the wafer workpieces as they are moving during beam treatment of said wafer workpieces.

4. The ion implanter of claim 1 wherein the temperature control maintains the inserts at a temperature greater than 50 degrees C. and less than 600 degrees C.

5. The ion implanter of claim 4 wherein the temperature control maintains the inserts at a temperature greater than 100 degrees C. and less than 300 degrees C.

6. The ion implanter of claim 1 wherein the inserts comprise members having exposed metal surfaces.

7. The ion implanter of claim 1 wherein the inserts comprise members having exposed alloys of metal surfaces.

8. The ion implanter of claim 1 wherein the inserts comprise members having exposed heat resistant polymer surfaces.

9. The ion implanter of claim 1 wherein the inserts comprise members having exposed ceramic surfaces.

10. The ion implanter of claim 1 wherein the inserts comprise an assembly which includes a substrate of collecting material bonded to a heater substrate and further wherein the assembly is bonded to an interior of an implanter process chamber.

11. The ion implanter of claim 10 wherein the heater substrate comprises a ceramic material.

12. The ion implanter of claim 10 wherein the heater substrate comprises electrical conductors for heating the assembly.

13. The ion implanter of claim 1 wherein the temperature control is coupled to an electrode in a heater element and further wherein the temperature control monitors an output from a temperature sensor to activate the electrode when a sensed temperature falls below an ON temperature and to de-active said electrode when a sensed temperature rises above an OFF temperature.

14. A method for use with an ion implanter having an ion source, a workpiece support and a transport system for delivering ions in an ion beam from the ion source to an ion implantation chamber that contains the workpiece support, comprising:
   mounting one or more removable inserts to an interior wall of either the transport system or the ion implantation chamber out of the ion beam for collecting material entering either the transport system or the ion implantation chamber due to collisions between ions and the workpiece within the ion implantation chamber during ion processing of the workpiece, and
   elevating a temperature of the one or more removable inserts to maintain the temperature of the one or more inserts at a controlled temperature to promote formation of a film on said one or more inserts during ion treatment due to collisions between ions and said workpiece.

15. The method of claim 14 wherein the workpiece support is mounted for movement within the implantation chamber during processing of one or more workpieces and wherein the inserts are mounted to chamber interior surfaces in close proximity to a path followed by the workpieces during processing.

16. The method of claim 15 wherein the workpiece support comprises a rotating support for a plurality of workpieces and wherein the inserts are positioned in an arc that corresponds to a path followed by the workpieces as they are moving during beam treatment of said workpieces.

17. The method of claim 14 wherein a temperature control maintains the inserts at a temperature greater than 50 degrees C. and less than 600 degrees C.

18. The method of claim 17 wherein the temperature control maintains the inserts at a temperature greater than 100 degrees C. and less than 300 degrees C.

19. The process of claim 14 wherein the inserts comprise metal substrates having collecting surfaces exposed to an implanter interior that are in thermal engagement with heater substrates.

20. The process of claim 14 wherein the inserts comprise metal alloy substrates having collecting surfaces exposed to an implanter interior that are in thermal engagement with heaters substrates.

21. The process of claim 14 wherein the inserts comprise ceramic substrates having collecting surfaces exposed to an implanter interior that are in thermal engagement with heaters substrates.

22. The process of claim 14 wherein the inserts comprise polymer substrates having collecting surfaces exposed to an implanter interior that are in thermal engagement with heaters substrates.

23. The method of claim 14 wherein the temperature control is coupled to an electrode and further comprising energizing the electrode to give off heat to an associated insert to maintain the inserts at an elevated temperature.

24. The method of claim 23 wherein the temperature control energizes the electrode when a sensed temperature is less than or equal to an ON temperature and de-energizes the electrode when a sensed temperature is greater than or equal to an OFF temperature.

* * * * *